United States Patent
Toulouse et al.

(10) Patent No.: US 12,353,194 B2
(45) Date of Patent: Jul. 8, 2025

(54) SYSTEM AND METHOD FOR ENVIRONMENTAL CONDITION MANAGEMENT

(71) Applicant: Dell Products L.P., Round Rock, TX (US)

(72) Inventors: Michael Mitsuo Toulouse, San Jose, CA (US); Benjamin David Behrendt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 376 days.

(21) Appl. No.: 17/971,140

(22) Filed: Oct. 21, 2022

(65) Prior Publication Data

US 2024/0134348 A1 Apr. 25, 2024
US 2024/0231317 A9 Jul. 11, 2024

(51) Int. Cl.
G05B 19/4155 (2006.01)

(52) U.S. Cl.
CPC ............. *G05B 19/4155* (2013.01); *G05B 2219/49216* (2013.01)

(58) Field of Classification Search
CPC ..... G05B 2219/49216; H05K 7/20827; H05K 7/20836; H02H 7/001
See application file for complete search history.

(56) References Cited

U.S. PATENT DOCUMENTS

| | | | | |
|---|---|---|---|---|
| 5,343,384 A | * | 8/1994 | Fisher | F04D 27/02 700/282 |
| 7,793,509 B2 | * | 9/2010 | Crane | F25B 49/025 417/2 |
| 10,590,937 B2 | * | 3/2020 | Goodfellow | F04B 41/00 |
| 10,838,440 B2 | * | 11/2020 | Ostrye | F24F 11/70 |
| 10,856,449 B2 | * | 12/2020 | Bailey | H05K 7/20827 |
| 2007/0056300 A1 | * | 3/2007 | Crane | F25B 49/025 62/175 |
| 2017/0292763 A1 | * | 10/2017 | Douglas | F24F 11/62 |
| 2018/0160570 A1 | * | 6/2018 | Bailey | F25B 49/02 |
| 2018/0213684 A1 | * | 7/2018 | Bailey | F25B 49/022 |

\* cited by examiner

*Primary Examiner* — Vincent H Tran
(74) *Attorney, Agent, or Firm* — Chamberlain, Hrdlicka, White, Williams & Aughtry; Aly Z. Dossa

(57) ABSTRACT

A cooling system for an information handling system includes multiple compressors, and a processor programmed to identify a first compressor in a compressor array. The identifying is performed in response to a determination that a change in the operation of a cooling system associated with the IHS is needed to maintain a temperature set point. Further, the cooling system includes the compressor array. The processor is also programmed to making a first determination that the first compressor in the compressor array is unavailable. Then, based on the first determination, identify a second compressor in the compressor array, make a second determination that the second compressor is available, and adjust an operation of the second compressor to implement the change.

7 Claims, 7 Drawing Sheets

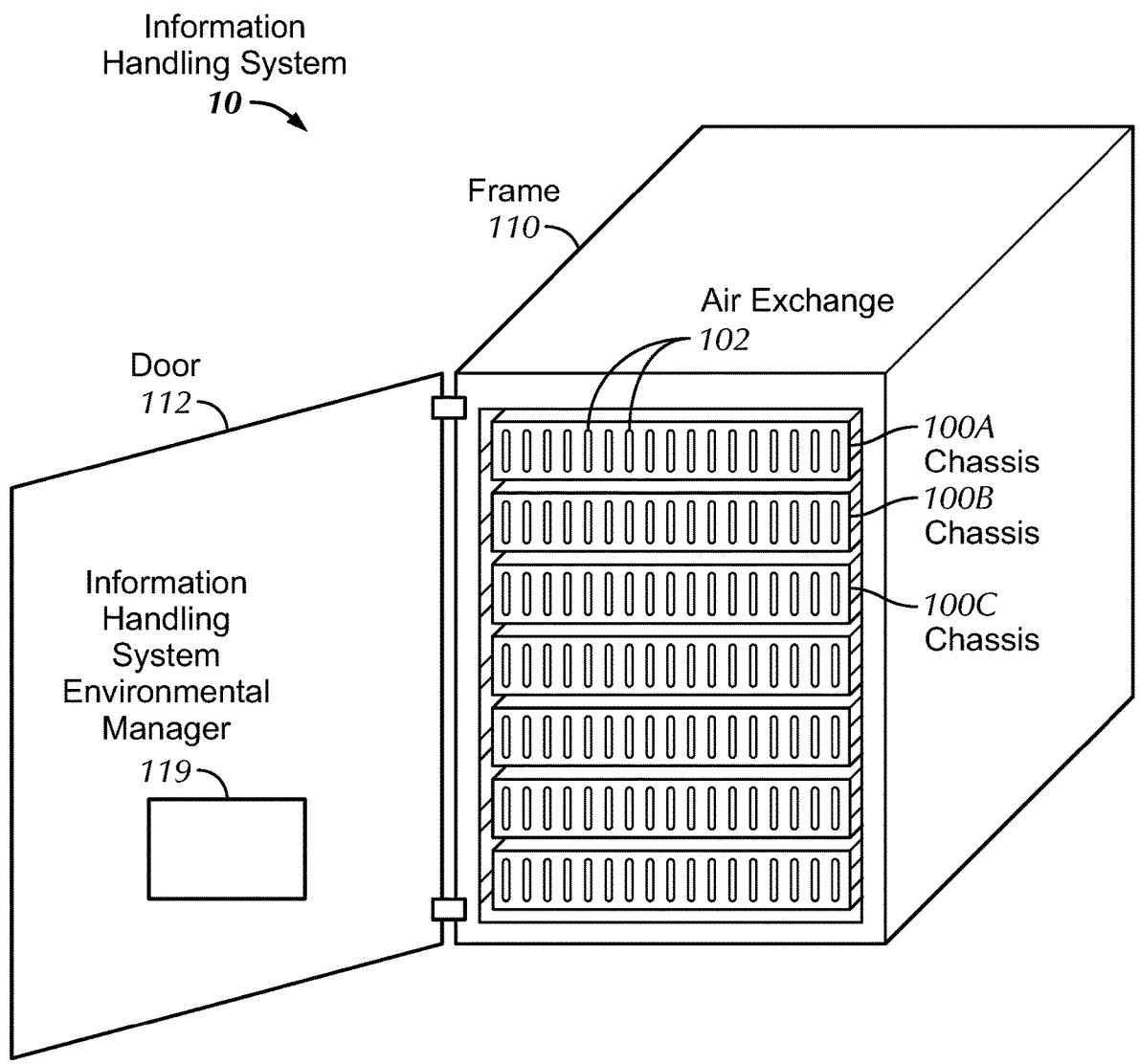
FIG. 1.1

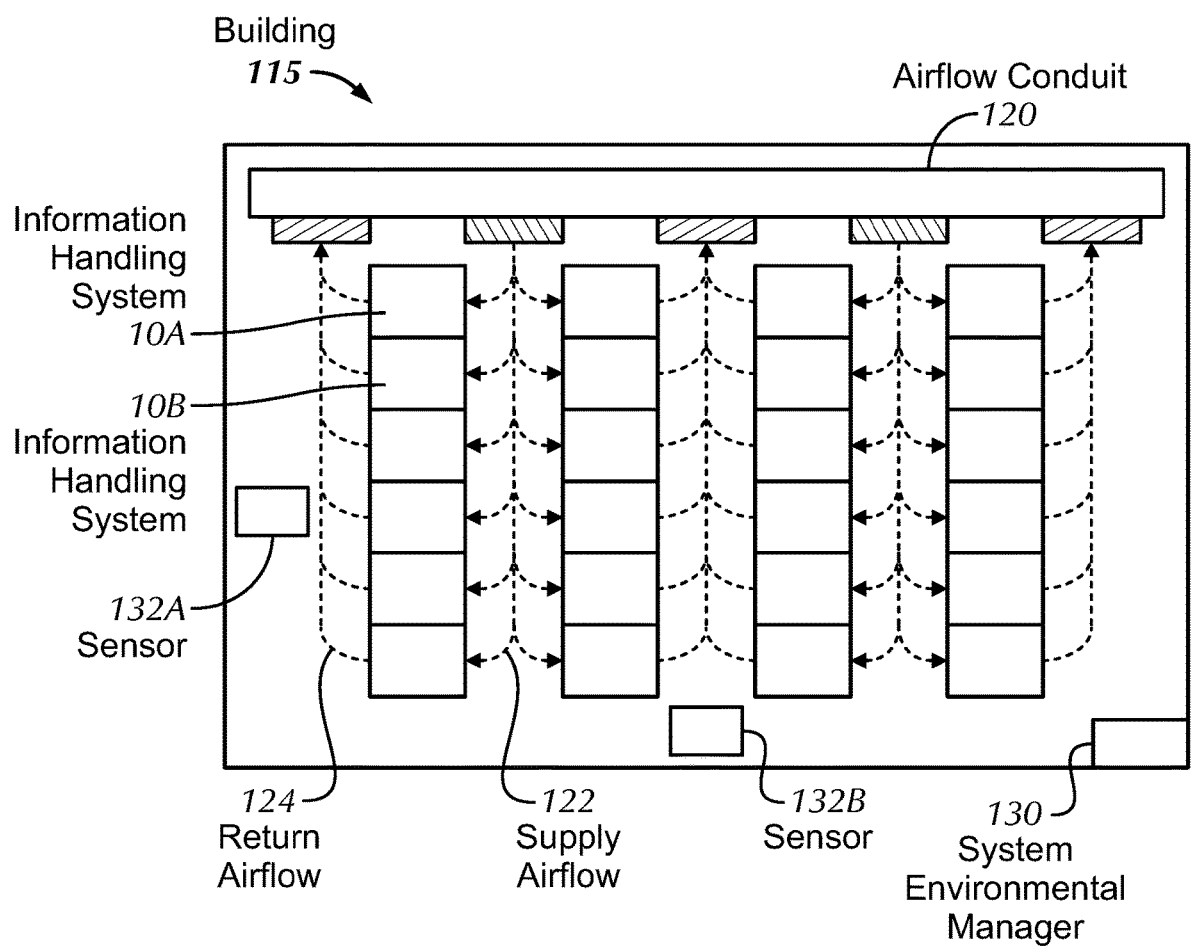
FIG. 1.2

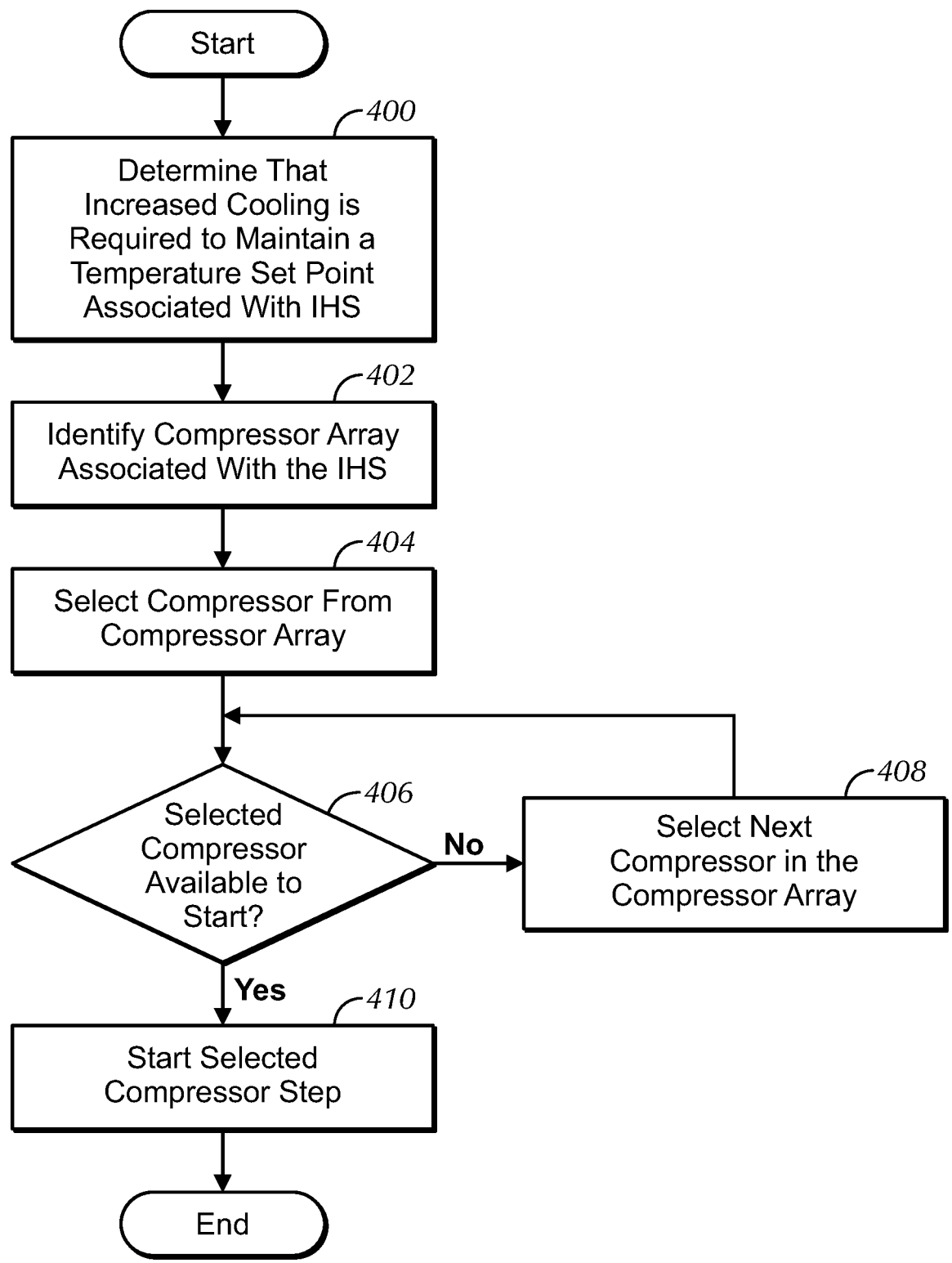
FIG. 4.1

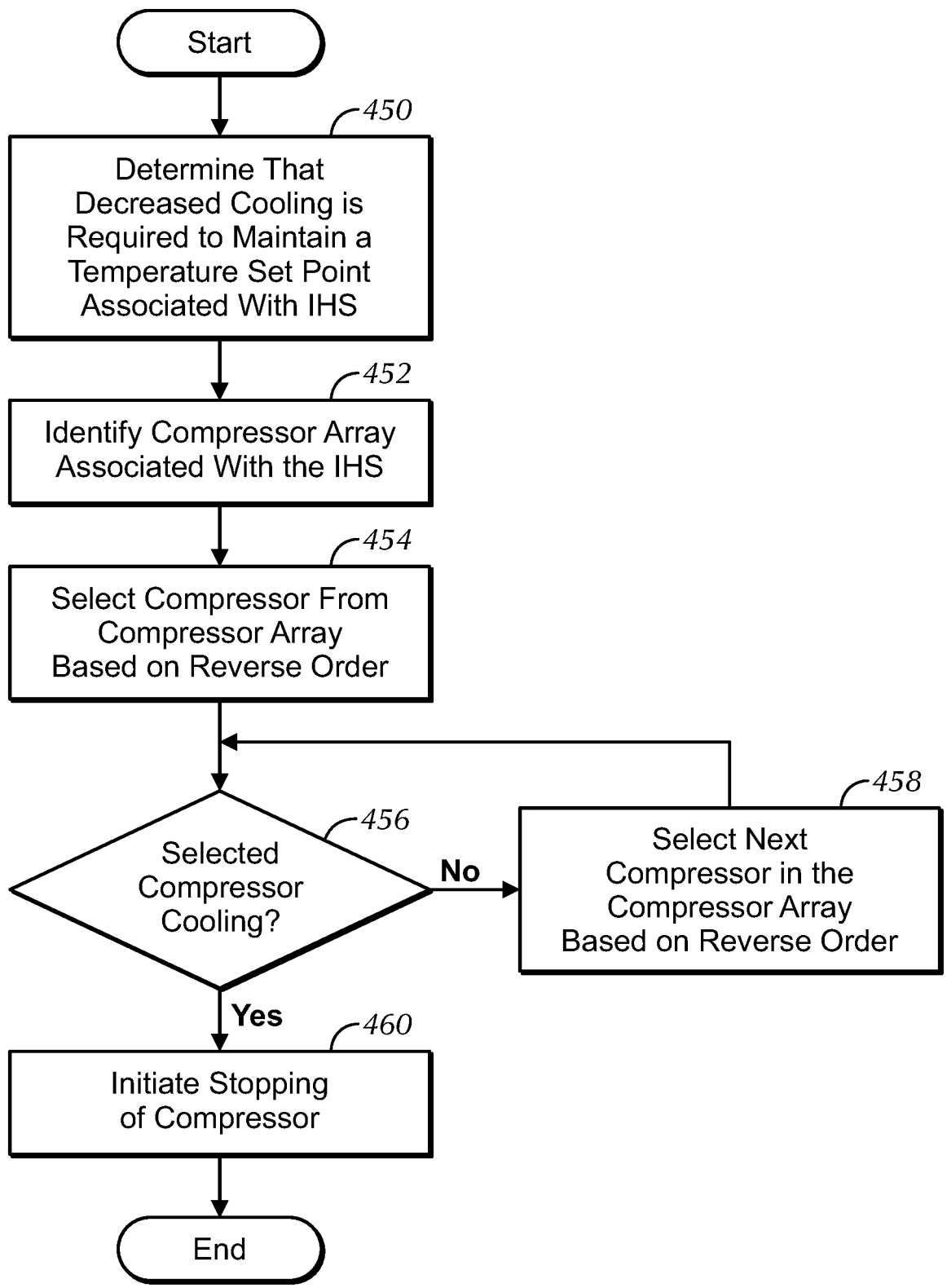
FIG. 4.2

SYSTEM AND METHOD FOR ENVIRONMENTAL CONDITION MANAGEMENT

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack two or more chassis in an information handling system. Due to the changing uses of information handling systems, chassis therein may be modular allowing for continual partial upgrades to the information handling system. That is, an information handling system may be composed of multiple chassis that may be attached to each other to form the information handling systems. When the multiple chassis are attached, components of the information handling system disposed in each of the chassis may become operably connected to each other.

SUMMARY

In general, in one aspect, embodiments relate to a method for environmentally managing an information handling system (IHS) in accordance with one or more embodiments of the invention includes identifying a first compressor in a compressor array. The identifying is performed in response to a determination that a change in the operation of a cooling system associated with the IHS is needed to maintain a temperature set point. Further, the cooling system includes the compressor array. The method also includes making a first determination that the first compressor in the compressor array is unavailable. Then, based on the first determination, identify a second compressor in the compressor array, make a second determination that the second compressor is available, and adjust an operation of the second compressor to implement the change.

In general, in one aspect, embodiments relate to a cooling system for an IHS includes multiple compressors, and a processor programmed to identify a first compressor in a compressor array. The identifying is performed in response to a determination that a change in the operation of a cooling system associated with the IHS is needed to maintain a temperature set point. Further, the cooling system includes the compressor array. The processor is also programmed to making a first determination that the first compressor in the compressor array is unavailable. Then, based on the first determination, identify a second compressor in the compressor array, make a second determination that the second compressor is available, and adjust an operation of the second compressor to implement the change.

In general, in one aspect, embodiments relate to a non-transitory computer readable medium includes computer readable program code, which, when executed by a computer processor enables the computer processor to perform a method for environmentally managing an IHS, the method in accordance with one or more embodiments of the invention includes identifying a first compressor in a compressor array. The identifying is performed in response to a determination that a change in the operation of a cooling system associated with the IHS is needed to maintain a temperature set point. Further, the cooling system includes the compressor array. The method also includes making a first determination that the first compressor in the compressor array is unavailable. Then, based on the first determination, identify a second compressor in the compressor array, make a second determination that the second compressor is available, and adjust an operation of the second compressor to implement the change.

Other aspects of the invention will be apparent from the following description and the appended claims.

BRIEF DESCRIPTION OF DRAWINGS

FIG. 1.1 shows a diagram of an information handling system in accordance with one or more embodiments of the invention.

FIG. 1.2 shows a diagram of a building that includes information handling systems in accordance with one or more embodiments of the invention.

FIG. 4.2 shows a flowchart of a method of managing environmental conditions in accordance with one or more embodiments of the invention.

DETAILED DESCRIPTION

Figure 2:
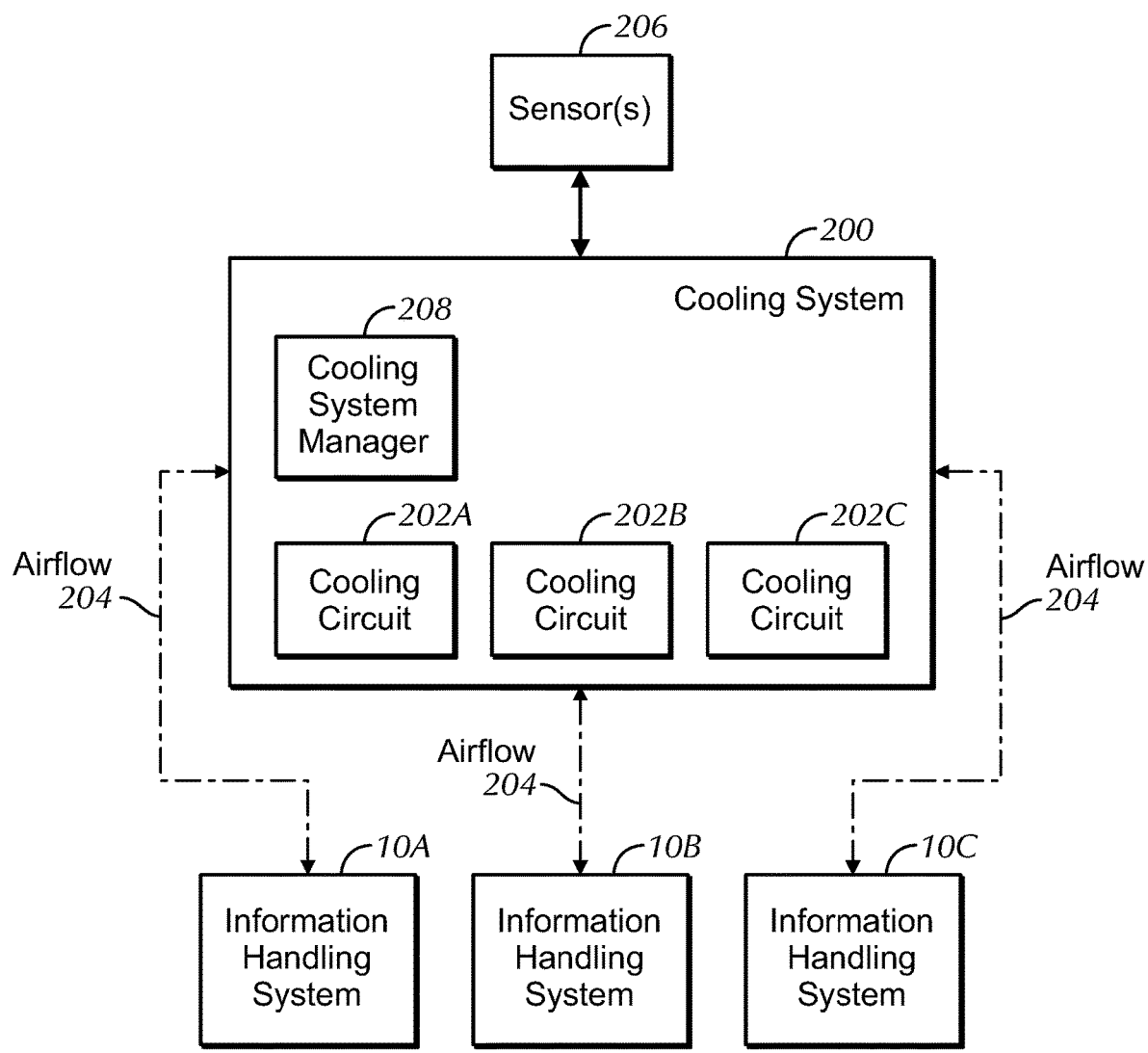
FIG. 2 shows a diagram of a cooling system for an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate the providing of the services of the information handling system. The computing components may include, for example, processors, memory modules, circuit cards that interconnect these components, etc.

During operation, these components may generate heat and require gas flows to maintain the temperatures of these components within nominal ranges. Further, these gas flows may be cooled by a cooling circuit to enhance the gas's ability to remove heat from the components. Compressors are utilized within the cooling circuits to provide the functionality of the cooling circuits. However, the compressors may not always be available for an adjustment in their operation. For example, a compressor that is already running cannot be instructed to run more. Likewise, a compressor that is already not running cannot be instructed to stop running.

Embodiments of the invention may provide methods and systems that manage environmental conditions. To manage environmental conditions, a system and/or method may manage operation of compressors to efficiently maintain a temperature set point. To manage operation of the compressors, the methods and systems may arrange the compressors in an order in an array. Then, a processor may proceed through the array to identify a compressor that is available to adjust its operation to maintain a temperature set point. The availability of the compressor may depend on an alarm status, a running status, and/or a lockout status (e.g., due to the compressor requiring a minimum off time).

The following describes various embodiments of the invention.

FIG. 1.1 shows an information handling system (10) in accordance with one or more embodiments of the invention. The system may include a frame (110) and any number of chassis (e.g., 100A, 100B, 100C).

The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis (e.g., direct airflows to the chassis). By managing the chassis, the frame (110) may enable multiple chassis to be densely packed in space without negatively impacting the operation of the information handling system (10). Further, the frame may include a door (112) to selectively provide access to the information handling system (10).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, a buildup of heat within a chassis may cause temperatures of the components disposed within the chassis to exceed preferred ranges.

The preferred ranges may include a nominal range in which the components respectively operate: (i) without detriment and/or (ii) are likely to be able to continue to operate through a predetermined service life of a component. Consequently, it may be desirable to maintain the temperatures of the respective components within the preferred range (e.g., a nominal range).

As described in further detail below, cooling systems (see e.g., FIG. 2) are utilized to set and maintain a temperature set point within the preferred range. The cooling system includes compressors that are utilized to maintain the temperature set point. However, the compressors are not always available for an adjustment in their operation for a number of factors (e.g., alarm status, running status, and/or lockout status). Thus, embodiments of the invention discussed below provide for a system and method to efficiently maintain the operation of the compressors.

To operate components within the preferred range of temperature, the chassis may include air exchanges (e.g., 102). An air exchange may be one or more openings in an exterior of a chassis that enables the chassis to exchange gases with an ambient environment. For example, a chassis may utilize air exchanges to (i) vent hot gases and (ii) intake cool gases. By doing so, the temperature of the gases within the chassis may be reduced. Consequently, the temperatures of components within the chassis may be reduced by utilizing the cooler gases taken into the chassis via an air exchange.

In one or more embodiments of the invention, managing the operation of the compressors may be handled by an information handling system environmental manager (119) that may be a computing device programmed to (i) identify compressors in an array, (ii) identify a compressor available to adjust its operation, and (iii) adjust an operation of the available compressor.

To decide which action to perform, the information handling system environmental manager (119) may obtain and/or be provided information regarding the environmental conditions (e.g., temperatures) within each of the chassis. For example, the system information system environmental manager (119) may be operably connected to environmental managers of each of the chassis via any combination of wired and/or wireless networks.

The information handling system environmental manager (119) may be implemented using a computing device. For additional details regarding computing devices, refer to FIG. 5. The information handling system environmental manager (119) may perform all, or a portion, of the methods illustrated in FIGS. 4.1-4.2 while providing its functionality.

In one or more embodiments of the invention, the information handling system environmental manager (119) may be implemented using a hardware device including circuitry. The information handling system environmental manager (119) may be implemented using, for example, a digital signal processor, a field programmable gate array, or an application specific integrated circuit. The information handling system environmental manager (119) may be implemented using other types of hardware devices without departing from the invention.

In one or more embodiments of the invention, the information handling system environmental manager (119) is implemented using computing code stored on a persistent storage that when executed by a processor performs all, or a portion, of the functionality of the information handling system environmental manager (119). The processor may be a hardware processor including circuitry such as, for example, a central processing unit or a microcontroller. The processor may be other types of hardware devices for processing digital information without departing from the invention.

To further clarify the environments in which cooling systems may be utilized, a diagram of an environment in which chassis of IHSs may reside is illustrated in FIG. 1.2.

Turning to FIG. 1.2, FIG. 1.2 shows a top view diagram of a building (115) in which chassis of IHSs may reside in accordance with one or more embodiments of the invention. The building (115) may house a data center (e.g., an aggregation of information handling systems) that includes any number of information handling systems (e.g., 10A, 10B). The information handling systems may include chassis which may need to take in and exhaust gases for temperature regulation purposes due to heat generation by components disposed in the chassis.

To facilitate gas management within the building (115), the information handling systems may be organized into rows (or other groupings of information handling systems). In FIG. 1.2, the rows of information handling systems extend from top to bottom along the page. To enable gases to be provided to the information handling systems (e.g., for temperature regulation purposes), an airflow conditioner (120) may be disposed within the building. The airflow conditioner (120) may provide supply airflow (122) and take in a return airflow (124). These airflows are illustrated as arrows having dashed tails.

The supply airflow (122) may be at a lower temperature than the return airflow (124). Consequently, when information handling systems obtain portions of the supply airflow (122), the information handling systems may be able to utilize the supply airflow (122) to cool components disposed within the chassis of the information handling systems. For example, gases from the supply airflow (122) may be passed by components disposed within chassis of information handling systems that are at elevated temperatures. The gases may be at a lower temperature than the components. Consequently, thermal exchange between the gases and the components may decrease the temperature of the components.

After utilizing the gases from the supply airflow (122), the information handling systems may exhaust the gases as the return airflow (124). After being exhausted from the information handling systems, the return airflow (124) may be obtained by the airflow conditioner (120), cooled, and recirculated as the supply airflow (122).

In addition to cooling the return airflow (124), the airflow conditioner (120) may be capable of obtaining gases from other areas (e.g., outside of the building), reducing the humidity level of an airflow, and/or otherwise conditioning gases for use by information handling systems and/or other devices.

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the airflow conditioner (120). By doing so, the system environmental manager (130) may cause the airflow conditioner (120) to provide gases to the information handling systems having a temperature and/or humidity level that may better enable the information handling systems to regulate their respective environmental conditions within the chassis of the respective information handling systems. However, conditioning the supply airflow (122) may utilize large amounts of energy.

The airflow conditioner (120) may include functionality to granularly, or at a macro level, modify the temperature and/or humidity level of the supply airflow (122). Consequently, different information handling systems (or groups thereof) may receive different supply airflows (e.g., 122) having different characteristics (e.g., different temperatures and/or humidity levels, different sources, etc.). For example, as discussed in greater detail below, the airflow conditioner (120) may be part of a cooling system that includes multiple cooling circuits. Each cooling circuit includes one or more compressors that may be variably operated. The compressors are not always available for an adjustment in their operation for a number of factors (e.g., alarm status, running status, and/or lockout status). Thus, embodiments of the invention discussed below provide for a system and method to efficiently maintain the operation of the compressors.

Conditioning the return airflow (124) or gases obtained from outside of the building (115) may be costly, consume large amounts of electricity, or may otherwise be undesirable. To reduce these costs, the system environmental manager (130) may set the operating point (e.g., desired temperature/humidity levels of different portions of the supply airflow (122)) of the airflow conditioner (120) to only provide the minimum necessary characteristics required by each of the IHSs so that it meets is service life goals. By doing so, the cost of providing the supply airflow (122) having characteristics required to meet the environmental requirements of the chassis of the information handling systems may be reduced.

To decide how to set the operating points of the airflow conditioner (120), the system environmental manager (130) may obtain and/or be provided information regarding the environmental conditions (e.g., temperatures, relative humidity levels, corrosion rates of components) within each of the chassis. For example, the system environmental manager (130) may be operably connected to environmental managers of each of the chassis and/or the airflow conditioner (120) via any combination of wired and/or wireless networks. The respective environmental managers of the chassis may provide such information to the system environmental manager (130) and/or service requests regarding the operating points of the airflow conditioner (120) via the operable connections.

In addition to, or as an alternative to the above, the system environmental manager (130) may obtain and/or be provided information regarding the environmental conditions (e.g., temperatures, relative humidity levels) via any number of sensors (e.g., 132A, 132B) positioned at one or more locations in the building (115). For example, the system environmental manager (130) may be operably connected to sensors (132) via any combination of wired and/or wireless networks. Further, the system environmental manager (130) may obtain and/or be provided information regarding the environmental conditions (e.g., temperatures, relative humidity levels) via sources outside the building (115) and/or control of the system environmental manager (130) that provides environmental conditions for an area at or near the building (115) (e.g., weather data).

The system environmental manager (130) may be implemented using a computing device. For additional details regarding computing devices, refer to FIG. 5. The system environmental manager (130) may perform all, or a portion, of the methods illustrated in FIGS. 4.1-4.2 while providing its functionality.

In one or more embodiments of the invention, the system environmental manager (130) may be implemented using a hardware device including circuitry. The system environmental manager (130) may be implemented using, for example, a digital signal processor, a field programmable gate array, or an application specific integrated circuit. The system environmental manager (130) may be implemented using other types of hardware devices without departing from the invention.

In one or more embodiments of the invention, the system environmental manager (130) is implemented using computing code stored on a persistent storage that when executed by a processor performs all, or a portion, of the functionality of the system environmental manager (130). The processor may be a hardware processor including circuitry such as, for example, a central processing unit or a microcontroller. The processor may be other types of hardware devices for processing digital information without departing from the invention.

FIG. 2 shows a diagram of a cooling system (200) in accordance with one or more embodiments of the invention. As discussed above, the cooling system (200) provides cooling to the IHSs (e.g., 10A, 10B, and 10C) via airflows (204), which may be the same supply airflow (122) and/or the return airflow (124) in FIG. 1.2. Cool air supplied by the cooling system (200) passes over components within the IHSs, thereby reducing their temperatures. The now heated air is then returned to the cooling system where the heated air passes through one or more of the cooling circuits (e.g., 202A, 202B, and/or 202C) to remove heat from the air and return the air to the IHSs for additional cooling.

In one or more embodiments of the invention, each cooling circuit (e.g., 202A, 202B, and/or 202C) may operate in conjunction with (i.e., in parallel or in series) another cooling circuit or independently from other cooling circuits. Further, each cooling circuit may contain all of the necessary components for removing heat from an airflow and providing cooled air to the IHSs. For example, each cooling circuit may include one or more compressors, each of which may be operated independently. In addition, the compressors may be coupled to one another in a series and/or parallel combination.

In one or more embodiments of the invention, the cooling system (200) may include a cooling system manager (208) that controls the operations of the cooling system (200). For example, the cooling system manager (208) may provide a temperature set point that the cooling system (200) maintains. The cooling system (200) includes one or more sensors (206) that measure a temperature at some location. For example, the sensors (206) may be the sensors (132A and/or 132B) in FIG. 1.2, sensors within one of the IHSs, or sensors positioned at any other suitable location. The cooling system manager (208) compares the temperature data from the sensors (206) to the temperature set point and determines whether a change in the operation of the cooling system (200) should be performed to maintain the temperature set point.

One of the changes in operation that can be performed is changing an operation of a compressor in one of the cooling circuits. For example, if the cooling system is being adjusted to reduce the temperature, one of the compressors may be instructed to turn on. Conversely, if the cooling system is being adjusted to increase the temperature, one of the compressors may be instructed to turn off. However, the compressors are not always available to change their operation to maintain the temperature set point. For example, the compressor may already be on when the temperature should be reduced or off when the temperature should be increased. Further, the compressors may shut off from time-to-time. When a compressor shuts off for any reason, the compressor must remain off for a minimum amount of time to allow for oil return and pressure equalization to allow for the compressor to reach a state ready for operation and to increase compressor reliability. While the compressor is shut off for the minimum period of time, the compressor may be considered in a lockout state meaning that the compressor is unavailable to turn on until the compressor is no longer in a lockout state. For example, the compressors may include systems that monitor the health of the compressor and disable running of the compressor if a status (e.g., an alarm status and/or unit enable status) is triggered, which may be triggered upon detecting a problem with one or more parts of the compressor.

In one or more embodiments of the invention, the cooling system manager (208) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the cooling system manager (208) described through this application and all, or a portion, of the method illustrated in FIGS. 4.1-4.2. The cooling system manager (208) may be implemented using other types of computing devices without departing from the invention. For additional details regarding computing devices, refer to FIG. 5.

In one or more embodiments of the invention, the cooling system manager (208) is implemented using distributed computing devices. As used herein, a distributed computing device refers to functionality provided by a logical device that utilizes the computing resources of one or more separate and/or distinct computing devices. For example, in one or more embodiments of the invention, the cooling system manager (208) is implemented using distributed devices that include components distributed across any number of separate and/or distinct computing devices. In such a scenario, the functionality of the cooling system manager (208) may be performed by multiple, different computing devices without departing from the invention.

Further, the cooling system manager (208) may store (e.g., in a memory module contained within the cooling system manager (208) or at any other suitable location) the compressors in an array, thus providing an order in which the cooling system manager (208) may analyze the compressors. Other data structures may be used to track the order of the compressors without departing from the invention.

Figure 3:
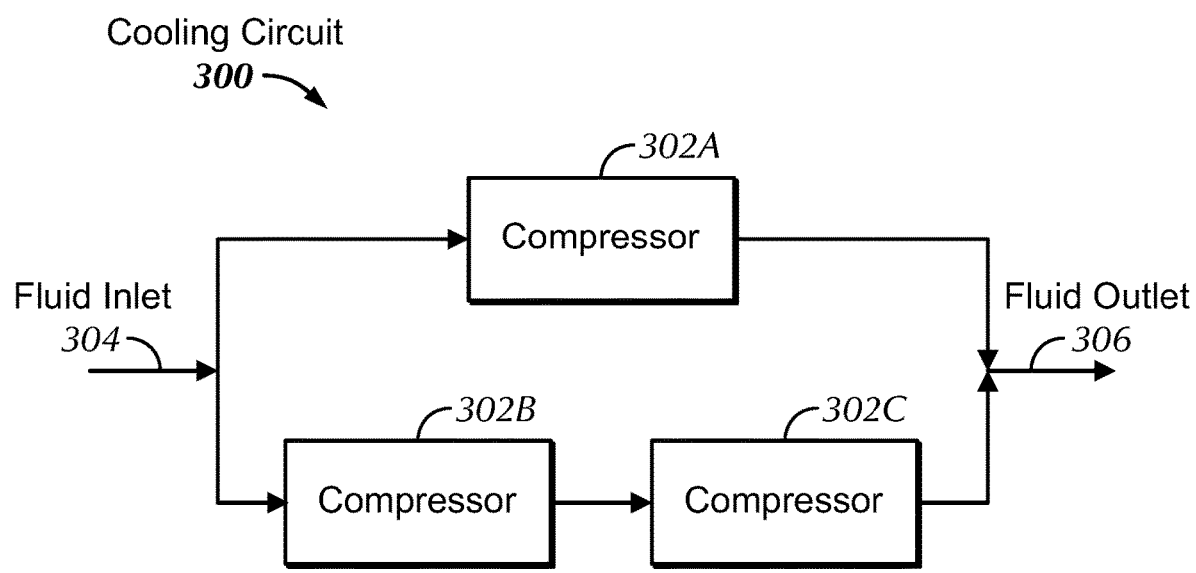
FIG. 3 shows a diagram of a cooling circuit for an information handling system in accordance with one or more embodiments of the invention FIG. 4.1 shows a flowchart of a method of managing environmental conditions in accordance with one or more embodiments of the invention.

FIG. 3 shows a diagram of a cooling circuit (300) in accordance with one or more embodiments of the invention. As discussed above, cooling circuits (e.g., 202A, 202B, and 202C, FIG. 2) include one or more compressors (302A, 302B, and/or 302C). During operation, a refrigerant flows through the cooling circuit (300) and experiences different pressure and temperature changes. As part of this process, the refrigerant passes through one or more of the compressors to increase the pressure of the refrigerant and, in some embodiments, also cause a phase shift of the refrigerant. For example, the refrigerant may enter one or more of the compressors at a fluid inlet (304), be compressed, and then exit the one or more compressors at a fluid outlet (306).

The compressors may be oriented in any suitable configuration. For example, in the present embodiment, the compressors are illustrated such that two of the compressors (e.g., 302B and 302C) are in a series configuration, and those two are in a parallel configuration with the third compressor (302A). However, it should be appreciated that the compressors may be positioned in any suitable combination and may include more or less compressors in series and/or more or less compressors in parallel.

To maintain the temperature set point, the cooling system manager (208) may: (i) determine that a change in the provided cooling is required to maintain a temperature set point associated with the IHS, (ii) analyze the compressors in the order provided by the array, (iii) determine which compressor is available to adjust its operation, and (iv) adjust the operation of the first available compressor.

To provide the above noted functionality of the cooling system manager (208), the cooling system manager (208) may perform all, or a portion, of the method illustrated in FIGS. 4.1-4.2.

In one or more embodiments of the invention, the cooling system manager (208) may be implemented using a hardware device including circuitry. The cooling system manager (208) may be implemented using, for example, a digital signal processor, a field programmable gate array, or an application specific integrated circuit. The cooling system manager (208) may be implemented using other types of hardware devices without departing from the invention.

In one or more embodiments of the invention, the cooling system manager (208) is implemented using computing code stored on a persistent storage that when executed by a processor performs all, or a portion, of the functionality of the cooling system manager (208). The processor may be a hardware processor including circuitry such as, for example, a central processing unit or a microcontroller. The processor may be other types of hardware devices for processing digital information without departing from the invention.

In one or more embodiments disclosed herein, the storage is implemented using devices that provide data storage services (e.g., storing data and providing copies of previously stored data). The devices that provide data storage services may include hardware devices and/or logical devices. For example, storage may include any quantity and/or combination of memory devices (i.e., volatile storage), long term storage devices (i.e., persistent storage), other types of hardware devices that may provide short term and/or long-term data storage services, and/or logical storage devices (e.g., virtual persistent storage/virtual volatile storage).

For example, storage may include a memory device (e.g., a dual in line memory device) in which data is stored and from which copies of previously stored data are provided. In another example, storage may include a persistent storage device (e.g., a solid state disk drive) in which data is stored and from which copies of previously stored data are provided. In a still further example, storage may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

While the cooling system manager (208) of FIG. 2 has been described and illustrated as including a limited number of specific components for the sake of brevity, an environmental manager in accordance with embodiments of the invention may include additional, fewer, and/or different components than those illustrated in FIG. 2 without departing from the invention.

Further, any of the components may be implemented as a service spanning multiple devices. For example, multiple computing devices housed in multiple chassis may each run respective instances of the cooling system manager (208). Each of these instances may communicate and cooperate to provide the functionality of the cooling system manager (208).

As discussed above with respect to FIG. 2, the cooling system manager (208) may provide environmental management services. FIG. 4.1 illustrates a method that may be performed by the cooling system manager (208) of FIG. 2 when providing environmental management services.

FIG. 4.1 shows a flowchart of a method in accordance with one or more embodiments of the invention. The method depicted in FIG. 4.1 may be used to manage a chassis environment in accordance with one or more embodiments of the invention. The method shown in FIG. 4.1 may be performed by, for example, a cooling system manager (e.g., 208, FIG. 2). Further, compressors discussed in relation to the method depicted in FIG. 4.1 may include the compressors (e.g., 302A, 302B, 302C) of FIG. 3. Other components of the system illustrated in FIGS. 1.1-3 may perform all, or a portion, of the method of FIG. 4.1 without departing from the invention.

While FIG. 4.1 is illustrated as a series of steps, any of the steps may be omitted, performed in a different order, additional steps may be included, and/or any or all of the steps may be performed in a parallel and/or partially overlapping manner without departing from the invention.

In step 400, it is determined that increased cooling is required to maintain a temperature set point associated with an IHS. As discussed above, a temperature set point associated with an IHS is established (e.g., by a user). Temperature data may be provided by one or more sensors associated with the IHS or a building containing IHSs. The determination may be made by comparing the temperature data from the sensors and the temperature set point. For example, if the difference between the temperature data and the temperature set point increases above a threshold value, the method may determine that increased cooling is required to maintain the temperature set point.

In step 402, a compressor array associated with the IHS is identified. The IHS includes a cooling system that includes multiple compressors. The compressor array provides the compressors in the cooling system in an ordered list such that the compressors' availability can be analyzed in an ordered manner. For example, as discussed above, the cooling system may include multiple cooling circuits, with each circuit containing one or more compressors. The compressor array includes all of the compressors in the cooling system in an ordered list.

The following example is provided to illustrate how a compressor array may be organized. An example cooling system includes three cooling circuits: a first cooling circuit that includes two compressors (i.e., compressor 1 and compressor 2), a second compressor that includes three compressors (i.e., compressor 3, compressor 4, and compressor 5), and a third cooling circuit that includes one compressor (i.e., compressor 6). The compressor array may be arranged in the following order: compressor 1, compressor 3, compressor 2, compressor 5, compressor 4, compressor 6. As can be seen, the order of the compressor array may include any order without departing from the invention.

In step 404, a compressor from the compressor array is selected. The compressor selected may be selected at random, selected based on a defined starting point in the compressor array, or selected based on a previous action. For example, the defined starting point in the compressor array may be the first position in the compressor array and the selected compressor is the first compressor in the compressor array. Further, the compressor array may be shifted periodically. For example, after an operation of a compressor has been adjusted, the order of the compressor array may be shifted such that the compressor whose operation was adjusted is positioned at the end of the compressor array. Further, the order of the compressor array may be shifted based on the number of thermal cycles experienced by each compressor. In addition, the order of the compressor array may be adjusted periodically. Other methods for tracking which compressor should be analyzed next in the compressor array may be used without departing from the invention.

In step 406, it is determined whether the selected compressor is available to start. The determination may be made based on whether the compressor is currently running. If the compressor is currently running, it is unavailable to start running. Similarly, if the compressor had previously been running and is now in a lockdown state. As discussed above, compressors may shut off from time-to-time and remain in a lockdown state for a minimum period of time following a shut off. While the compressor is in this lockdown state, the compressor is unavailable to start running. Further, the compressor may be unavailable to start running for other reasons (e.g., if the compressor is experiencing a problem and cannot start running).

If it is determined that the selected compressor is not available to start, the method proceeds to step 408. In step 408, the next compressor in the compressor array is selected. Then, the method proceeds back to step 406 in which it is determined whether the compressor selected in step 408 is available to start.

By methodically searching the compressor array for an available compressor, the method provides a fast and efficient way to increase cooling by utilizing the availability of all of the compressors in the cooling system. The provided method may reduce thermal cycling on the compressors by spreading usage of the compressors more evenly across all of the compressors. The method may also reduce temperature overshoots (i.e., over the temperature set point) by more quickly starting compressors as compared to waiting for compressors to become available. Further, the method may reduce total compressor run-time by starting compressors at lower overshoots over the temperature set point. Further, by providing a more consistent temperature range, the provided method may reduce failure rates of components within the associated IHS.

If it is determined that the selected compressor is available to start in step 406, the method proceeds to step 410. In step 410, the selected compressor is started. Starting the compressor then increases the cooling provided by the cooling system, thus enabling the method to provide the increased cooling required to maintain the temperature set point.

The method may end following step 410.

FIG. 4.2 shows a flowchart of a method in accordance with one or more embodiments of the invention. The method depicted in FIG. 4.2 may be used to manage a chassis environment in accordance with one or more embodiments of the invention. The method shown in FIG. 4.2 may be performed by, for example, a cooling system manager (e.g., 208, FIG. 2). Further, compressors discussed in relation to the method depicted in FIG. 4.1 may include the compressors (e.g., 302A, 302B, 302C) of FIG. 3. Other components of the system illustrated in FIGS. 1.1-3 may perform all, or a portion, of the method of FIG. 4.2 without departing from the invention.

While FIG. 4.2 is illustrated as a series of steps, any of the steps may be omitted, performed in a different order, additional steps may be included, and/or any or all of the steps may be performed in a parallel and/or partially overlapping manner without departing from the invention.

In step 450, it is determined that decreased cooling is required to maintain a temperature set point associated with an IHS. As discussed above, a temperature set point associated with an IHS is established (e.g., by a user). Temperature data may be provided by one or more sensors associated with the IHS or a building containing IHSs. The determination may be made by comparing the temperature data from the sensors and the temperature set point. For example, if the difference between the temperature data and the temperature set point increases above a threshold value, the method may determine that decreased cooling is required to maintain the temperature set point.

In step 452, a compressor array associated with the IHS is identified. The IHS includes a cooling system that includes multiple compressors. The compressor array provides the compressors in the cooling system in an ordered list such that the compressors' availability can be analyzed in an ordered manner. For example, as discussed above, the cooling system may include multiple cooling circuits, with each circuit containing one or more compressors. The compressor array includes all of the compressors in the cooling system in an ordered list.

The following example is provided to illustrate how a compressor array may be organized. An example cooling system includes three cooling circuits: a first cooling circuit that includes two compressors (i.e., compressor 1 and compressor 2), a second compressor that includes three compressors (i.e., compressor 3, compressor 4, and compressor 5), and a third cooling circuit that includes one compressor (i.e., compressor 6). The compressor array may be arranged in the following order: compressor 1, compressor 3, compressor 2, compressor 5, compressor 4, compressor 6. As can be seen, the order of the compressor array may include any order without departing from the invention.

In step 454, a compressor from the compressor array is selected based on a reversed order. Using the above example, selecting based on the reverse order may select compressor 6 first, then compressor 4, etc. The compressor selected may be selected at random, selected based on a defined starting point in the compressor array, or selected based on a previous action. For example, the defined starting point in the compressor array may be the first position in the compressor array and the selected compressor is the first compressor in the compressor array. Further, the compressor array may be shifted periodically. For example, after an operation of a compressor has been adjusted, the order of the compressor array may be shifted such that the compressor whose operation was adjusted is positioned at the end of the compressor array. Further, the order of the compressor array may be shifted based on the number of thermal cycles experienced by each compressor. Other methods for tracking which compressor should be analyzed next in the compressor array may be used without departing from the invention.

By reversing the order of the compressor array, the compressors' availability will be analyzed in an order opposite to the order the compressors are analyzed when increased cooling is required. In this manner, the last running compressor will be the first to be turned off.

In step 456, it is determined whether the selected compressor is currently running and thereby providing cooling. If the selected compressor is currently running, then it is available to stop running. However, if the selected compressor is not currently running, then it is not available to stop running.

If it is determined that the selected compressor is not available to stop, the method proceeds to step 458. In step 458, the next compressor in the compressor array is selected based on the reverse order of the compressor array. Then, the method proceeds back to step 456 in which it is determined whether the compressor selected in step 458 is currently running.

By methodically searching the compressor array for an available compressor, the method provides a fast and efficient way to decrease cooling by utilizing the availability of all of the compressors in the cooling system. The provided method may reduce thermal cycling on the compressors by spreading usage of the compressors more evenly across all of the compressors. The method may also reduce temperature overshoots (i.e., over the temperature set point) by more quickly stopping compressors as compared to waiting for compressors to become available. Further, the method may reduce total compressor run-time by stopping compressors at lower overshoots over the temperature set point. Further, by providing a more consistent temperature range, the provided method may reduce failure rates of components within the associated IHS.

If it is determined that the selected compressor is currently running in step 456, the method proceeds to step 460. In step 460, stoppage of the selected compressor is initiated. Stopping the compressor then decreases the cooling provided by the cooling system, thus enabling the method to provide the decreased cooling required to maintain the temperature set point.

The method may end following step 460.

Figure 5:
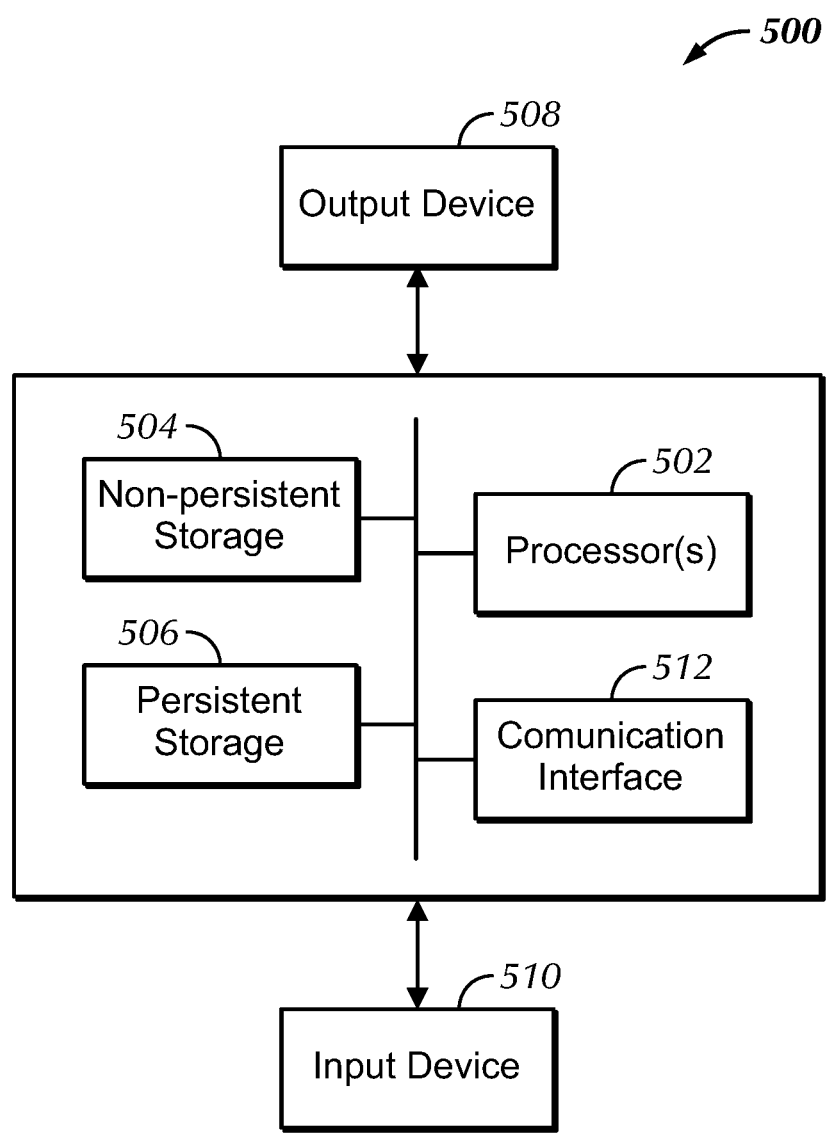
FIG. 5 shows a diagram of a computing device in accordance with one or more embodiments of the invention.

Embodiments of the invention may be implemented using a computing device. FIG. 5 shows a diagram of a computing device in accordance with one or more embodiments of the invention. The computing device (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), input devices (510), output devices (508), and numerous other elements (not shown) and functionalities. Each of these components is described below.

In one embodiment of the invention, the computer processor(s) (502) may be an integrated circuit for processing instructions. For example, the computer processor(s) may be one or more cores or micro-cores of a processor. The computing device (500) may also include one or more input devices (510), such as a touchscreen, keyboard, mouse, microphone, touchpad, electronic pen, or any other type of input device. Further, the communication interface (512) may include an integrated circuit for connecting the computing device (500) to a network (not shown) (e.g., a local area network (LAN), a wide area network (WAN) such as the Internet, mobile network, or any other type of network) and/or to another device, such as another computing device.

In one embodiment of the invention, the computing device (500) may include one or more output devices (508), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506). Many different types of computing devices exist, and the aforementioned input and output device(s) may take other forms.

Embodiments of the invention may provide an improved method for managing components of an information handling system. Specifically, embodiments of the invention may provide a method and systems for efficiently managing environmental conditions of an information handling system to fail. To do so, embodiments of the invention may provide a method and/or system that adjusts operations of a compressor in a cooling system.

By doing so, the systems and methods may reduce thermal cycling on the compressors by spreading usage of the compressors more evenly across all of the compressors. The systems and methods may also reduce temperature overshoots (i.e., over the temperature set point) by more quickly starting compressors as compared to waiting for compressors to become available. Further, the systems and methods may reduce total compressor run-time by starting compressors at lower overshoots beyond the temperature set point. Further, by providing a more consistent temperature range, the provided systems and methods may reduce failure rates of components within the associated IHS.

The problems discussed above should be understood as being examples of problems solved by embodiments of the invention disclosed herein, and the invention should not be limited to solving the same/similar problems. The disclosed invention is broadly applicable to address a range of problems beyond those discussed herein.

One or more embodiments of the invention may be implemented using instructions executed by one or more processors of the computing device (500). Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for managing environmental conditions of an information handling system (IHS), comprising:
    making a first determination that increased cooling provided by a cooling system associated with the IHS is needed to maintain a temperature set point;
    identifying, in response to the first determination, a first compressor in a compressor array, wherein the cooling system comprises the compressor array, and wherein compressors in the compressor array are organized in an order;
    making a second determination that the first compressor in the compressor array is already running;
    based on the second determination:
        identifying a second compressor in the compressor array, based on the second compressor being after the first compressor in the order;
        making a third determination that the second compressor is available; and
        starting, based on the third determination, operation of the second compressor;
    making a fourth determination that reduced cooling provided by the cooling system is needed to maintain the temperature set point;
    identifying, in response to the fourth determination, a third compressor in a compressor array, wherein the third compressor is after the second compressor in the order;
    making a fifth determination that the third compressor in the compressor array is not running;
    based on the fifth determination:
        identifying the second compressor in the compressor array, based on the second compressor being before the third compressor in the order;
        making a sixth determination that the second compressor is running; and
        stopping, based on the sixth determination, operation of the second compressor.

2. The method of claim 1, wherein the first compressor and the second compressor are arranged in parallel.

3. The method of claim 1, wherein the first compressor and the second compressor are arranged in series.

4. The method of claim 1, wherein the first compressor is associated with a first cooling circuit and the second compressor is associated with a second cooling circuit.

5. A cooling system for an information handling system (IHS) comprising:
    a plurality of compressors; and
    a processor programmed to:
        make a first determination that increased cooling provided by a cooling system associated with the IHS is needed to maintain a temperature set point;
        identify, in response to the first determination, a first compressor in a compressor array, wherein the cooling system comprises the compressor array, and wherein compressors in the compressor array are organized in an order;
        make a second determination that the first compressor in the compressor array is already running;
        based on the second determination:
            identify a second compressor in the compressor array, based on the second compressor being after the first compressor in the order;
            make a third determination that the second compressor is available; and
        starting, based on the third determination, operation of the second compressor;
        make a fourth determination that reduced cooling provided by the cooling system is needed to maintain the temperature set point;
        identify, in response to the fourth determination, a third compressor in a compressor array, wherein the third compressor is after the second compressor in the order;
        make a fifth determination that the third compressor in the compressor array is not running;
        based on the fifth determination:
            identify the second compressor in the compressor array, based on the second compressor being before the third compressor in the order;
            make a sixth determination that the second compressor is running; and
            stop, based on the sixth determination, operation of the second compressor.

6. The cooling system of claim 5, wherein the first compressor is associated with a first cooling circuit and the second compressor is associated with a second cooling circuit.

7. A non-transitory computer readable medium comprising computer readable program code, which, when executed by a computer processor enables the computer processor to perform a method for managing environmental conditions of an information handling system (IHS), the method comprising:
    making a first determination that increased cooling provided by a cooling system associated with the IHS is needed to maintain a temperature set point;
    identifying, in response to the first determination, a first compressor in a compressor array, wherein the cooling system comprises the compressor array, and wherein compressors in the compressor array are organized in an order;
    making a second determination that the first compressor in the compressor array is already running;
    based on the second determination:
        identifying a second compressor in the compressor array, based on the second compressor being after the first compressor in the order;
        making a third determination that the second compressor is available; and
        starting, based on the third determination, operation of the second compressor;
    making a fourth determination that reduced cooling provided by the cooling system is needed to maintain the temperature set point;
    identifying, in response to the fourth determination, a third compressor in a compressor array, wherein the third compressor is after the second compressor in the order;
    making a fifth determination that the third compressor in the compressor array is not running;
    based on the fifth determination:
        identifying the second compressor in the compressor array, based on the second compressor being before the third compressor in the order;
        making a sixth determination that the second compressor is running; and stopping, based on the sixth determination, operation of the second compressor.

* * * * *